(12) United States Patent
Koh et al.

(10) Patent No.: US 7,378,301 B2
(45) Date of Patent: May 27, 2008

(54) METHOD FOR MOLDING A SMALL FORM FACTOR DIGITAL MEMORY CARD

(75) Inventors: Wei H. Koh, Irvine, CA (US); Ben W. Chen, Fremont, CA (US); David H. D. Chen, Irvine, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 421 days.

(21) Appl. No.: 11/148,999

(22) Filed: Jun. 10, 2005

(65) Prior Publication Data
US 2006/0281229 A1    Dec. 14, 2006

(51) Int. Cl.
H01L 21/50 (2006.01)
H01L 21/48 (2006.01)
H01L 21/44 (2006.01)
H01L 23/28 (2006.01)
H01L 23/495 (2006.01)
H01L 23/31 (2006.01)

(52) U.S. Cl. .............. 438/126; 438/127; 438/106; 438/112; 438/124; 257/787; 257/679; 257/667; 257/E23.116; 257/E23.125; 257/E23.128

(58) Field of Classification Search .......... 438/126, 438/127, 106, 112, 124; 257/787, 679, 667, 257/E23.116, E23.125, E23.128
See application file for complete search history.

(56) References Cited

U.S. PATENT DOCUMENTS

| | | | | |
|---|---|---|---|---|
| 5,173,840 A | * | 12/1992 | Kodai et al. | 361/737 |
| 6,462,273 B1 | * | 10/2002 | Corisis et al. | 174/521 |
| 7,089,661 B2 | * | 8/2006 | Fong et al. | 29/841 |
| 7,174,628 B1 | * | 2/2007 | Wang et al. | 29/841 |

* cited by examiner

*Primary Examiner*—Luan Thai
(74) *Attorney, Agent, or Firm*—Morland C. Fischer

(57) ABSTRACT

A method for molding digital storage memory cards such as, for example, multimedia cards (MMC), secure digital cards (SD), and similar small form factor digital memory cards. A PCA subassembly including, for example, a leadframe (TSOP) package for enclosing a flash IC and a (e.g., land grad array) controller package for enclosing a controller IC are mounted on a printed wiring board within a mold cavity. A high melt flow index resin is injected into the mold cavity to form an integral, solid body within which to completely encapsulate the flash IC and controller packages and form a cover over top the flash IC package so as to maintain the required memory card height tolerance. In one embodiment, the resin material is injected downwardly into the mold cavity from locations above the respective rows of leads of the flash IC package. In another embodiment, the resin material is injected laterally into the mold body from locations at opposite sides thereof adjacent the respective rows of leads of the flash IC package.

13 Claims, 5 Drawing Sheets

METHOD FOR MOLDING A SMALL FORM FACTOR DIGITAL MEMORY CARD

BACKGROUND OF THE INVENTION

1. Field of the Invention

This invention relates to a method for molding digital storage memory cards such as, for example, multimedia cards (MMC), secure digital cards (SD), and similar small form factor digital memory cards.

2. Background Art

Thin form factor digital flash memory cards such as secure digital (SD), mini-SD, multimedia cards (MMC), and others contain three major components: an active flash memory device (including a flash IC and its controller); a printed circuit board (PCB) substrate; and an exterior cover that is typically manufactured from plastic. There are commonly two conventional methods of making these thin form factor digital memory cards.

The first method requires that semiconductor packages are surface mounted on the PCB substrate by way of a SMT production line. In this case, the active components (i.e., the flash memory and controller ICs) are located inside the semiconductor packages. These IC packages along with the necessary passive components (including surface mounted resistors and capacitors) form a complete subassembly that is known as a printed circuit board assembly (PCA). The finished card assembly is then completed by mating a plastic cover on top or two separate plastic covers on the top and bottom thereof in accordance with the standard design specifications. The thin cover top is typically molded plastic, but other materials (e.g., including a combination of metal and plastic) can also be employed.

The second conventional method for making a thin form factor digital flash card having a PCA subassembly is by means of a chip-on-board (COB). In the usual COB process, the active flash IC chips and their respective controller chips are mounted to the PCB substrate in a "chip and wire" process. That is, bare chips are assembled on the PCB substrate using wirebonds. However, the ICs are not assembled in a package as would otherwise occur in the aforementioned SMT production line assembly process. Nevertheless, when using the COB process, the supporting passive components may still need to be surface mounted to the substrate by means of an SMT assembly line. For a COB, the flash IC and its controller may be placed face up and a conventional wirebond (i.e., chip and wire) method is used to interconnect the I/O of the IC to the PCB substrate to thereby form the PCA subassembly. After the die attach and wirebond, it is usually necessary to apply an encapsulant over the bare flash and controller chips and their respective wires to provide suitable protection. This encapsulation step can be achieved by using either liquid encapsulants (globtop) or electronic molding compound (EMC) that are applied to the COB by means of a transfer mold. After encapsulation by either globtop or transfer mold, the finished PCA subassembly is then completed with an appropriate cover to achieve the final form factor for the intended memory card assembly.

It can be appreciated that for either of the two memory card assembly methods described above, the final step of making the finished card is attaching a (e.g., plastic) preformed cover. This cover can be a separate molded part and attached to the PCA by means of a thin layer of adhesive film. In the alternative, the cover can be bonded to the substrate of the PCA by ultrasonic fusion of the plastic material.

Alternatively, there is a more desirable method for forming and attaching the cover atop the PCA subassembly. This method includes injection molding directly over the PCA subassembly where the cover is formed in situ above the PCA packages. Therefore, there is no need to assemble a separate, preformed cover. This approach lowers the cost relative to requiring an adhesive or ultrasonic bonding of a separately preformed cover to the PCA subassembly.

What is more, injection molded parts have many advantages over a memory card assembly that requires a two part assembly process. In injection molding, the molded resin material will fill up all of the internal spaces inside the PCA subassembly. Thus, the finished memory card is mechanically more rigid and robust. Similarly, the card assembly will be more moisture resistant because there are no voids inside the card and no recessed grooves or large seams formed in the bond lines that are otherwise formed in the conventional two part (PCA and preformed cover) assembly. Injection molded parts also permit better dimensional stability and compliance to the design specifications of the memory card.

Even though such an injection molded method is more desirable and cost efficient, this method is presently applicable only to those PCAs that are manufactured by the COB process. The desirable injection molded method has not typically been applicable to PCAs that are made from the IC package/SMT process. The reason for this limitation is that IC packages having a commonly used TSOP (thin small outline package) format are thicker than the COB bare dice. Hence, any PCA using conventional TSOP packages would have a higher profile or body height than those made with the COB chip and wire process. A lower PCA assembly profile is necessary to permit injection molding such that sufficient resin material will flow into the narrow gap above the TSOP package while complying with the final finished memory card thickness requirement. When a conventional TSOP package is used to carry the flash IC in the PCA, the height of the TSOP package plus its substrate in the PCA is already approaching the maximum allowed overall thickness of the final memory card assembly. This leaves very little room for injection molding in areas directly above the TSOP package. Therefore, a PCA containing relatively tall packages, like the standard TSOP package, is unsuitable for injection molding. In other words, only COB PCAs having lower heights can be successfully used with an injection mold process.

Although the injection mold process to form an integral cover for the final memory card assembly is more direct and less costly, the conventional assembly steps of making a PCA by means of COB has other drawbacks which could reduce the advantage of the final injection mold step. One reason for some COB process drawbacks includes the requirement that the PCB substrates must have a soft gold surface finish on the wirebond pad area for gold wirebonding. This requirement increases the cost, because gold is plated onto the substrate and additional provisions must be provided to have plating bus lines running to the pads during such electric plating.

Another drawback is the result of the wirebond IC requiring protection by means of a liquid encapsulant in either globtop dispensing or transfer mold. This protection step requires additional time and cost. In addition, the cover is injection molded over the encapsulated PCA.

Yet another process drawback of COB is that the bare die that is mounted on the PCA typically cannot be fully tested and replaced, if necessary. After the assembly, if the flash IC or controller is found to be defective, the entire PCA subassembly will have to be discarded in its entirety.

Hence, there is a need for a manufacturing process by which to make a memory card assembly that can be used in high volume production with high yield and low assembly cost that is applicable to both a COB assembled PCA and to a TSOP assembled PCA. The injection mold material should be capable of fitting in the narrow space limitations above the TSOP package area while not causing damage to the connection of the TSOP package and the IC that is carried therewithin.

SUMMARY OF THE INVENTION

In general terms, disclosed herein is a method by which special injection mold materials are applied at particular runner gate locations to enable injection molding over a PCA having a TSOP (thin small outline package) that allows only a minimal gap thereover for the completion of a protective cover. The finished molded part will conform to the standard card design specification for thickness. More particularly, a method is disclosed for molding a digital storage memory card, such as a multimedia card (MMC), a secure digital card (SD), or a similar small form factor digital memory card. The memory card assembly includes a solid mold body which encapsulates a PCA subassembly. The PCA subassembly includes a TSOP flash IC package for a flashcard IC and a land grad array controller package for a controller IC. The flashcard and controller packages are surface mounted on a PCB laminate substrate. A high melt flow index (e.g., of at least 10) thermoset resin material is injected into a mold cavity to reliably cover and surround the PCA subassembly and thereby complete a solid, integral and rugged liquid tight structure that resists bending forces. That is to say, the finished memory card assembly includes an integral cover that is located over top the relatively thin gap that is available above the TSOP package while filling in all of the open spaces around the PCA subassembly and conforming to the finished memory card assembly height requirements.

Runner gate openings at which to inject the resin mold material from respective runner gates into the mold cavity to encapsulate the PCA subassembly are preferably located above the rows of external leads along opposite sides of the TSOP flashcard package. In addition, a runner gate opening may be located above the front edge of the flashcard package. Thus, resin will flow downwardly from an overhead location to first cover the leads and then the top of the flashcard package. By virtue of the top down resin flow pattern, the lateral shear forces and the bending forces to be applied to the TSOP flashcard package during molding will be reduced so as to correspondingly reduce the possibility of damaging the delicate flash IC that is inside the flash IC package.

In an alternate embodiment, the runner gate openings are located at opposite sides of the mold cavity adjacent the rows of external leads along the sides of the TSOP flash IC package. In this case, the runner gates are axially aligned relative to one another at the left and right sides of the mold cavity so that the mold material can be simultaneously injected from the runner gates into the cavity in order to first cover the leads of the TSOP flash IC package and thereby reinforce the solder connections of the leads to the PCB substrate. In this same regard, the lateral and normal forces to which the flash IC package will be subjected are more evenly distributed so as to avoid a possible disconnection of the leads from the PCB substrate.

DESCRIPTION OF THE PREFERRED EMBODIMENT

Figure 1:
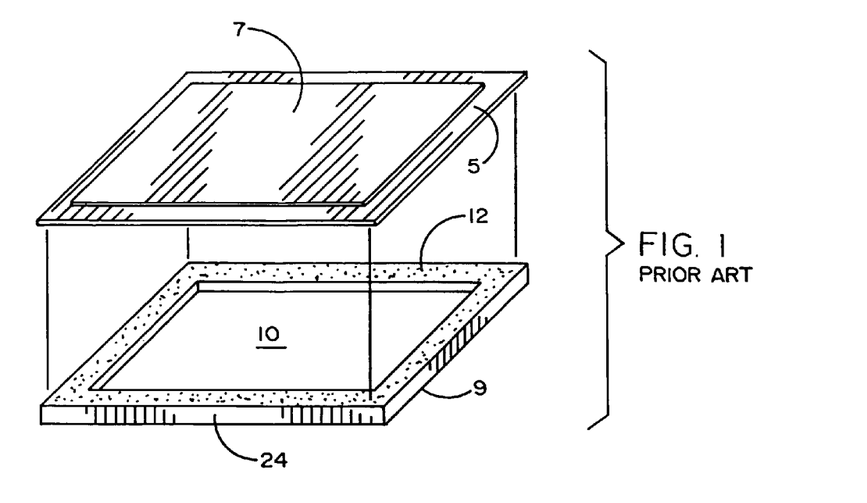
FIG. 1 shows a conventional case subassembly to surround a PCA subassembly that is mounted on a printed circuit board substrate.
Figure 2:
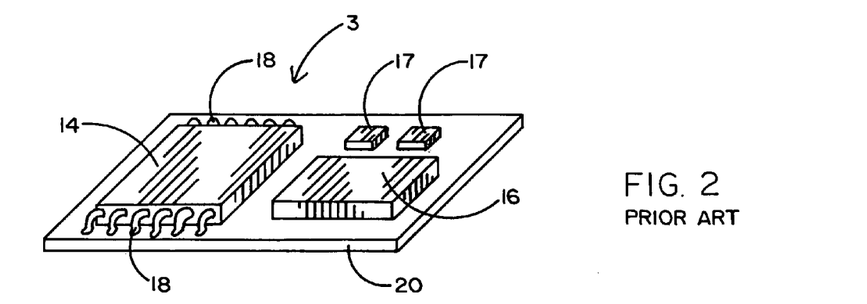
FIG. 2 shows details of flash and controller packages of a PCA subassembly to be located in the conventional case subassembly of FIG. 1.
Figure 3:
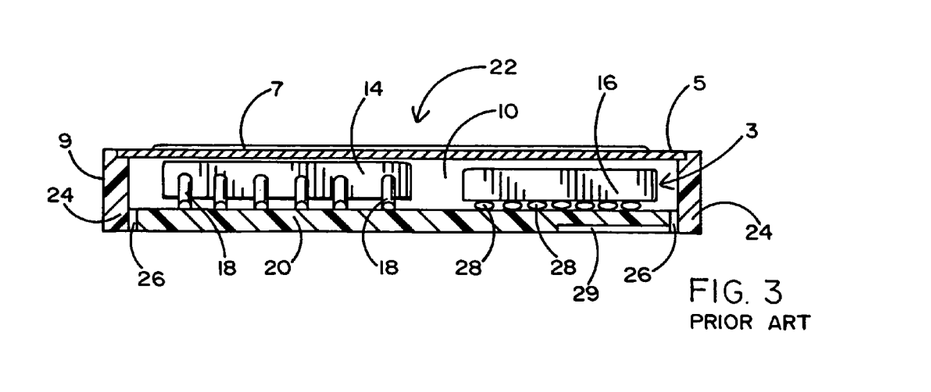
FIG. 3 shows a conventional memory card assembly with the PCA subassembly of FIG. 2 surrounded by the case subassembly of FIG. 1.

FIG. 1 of the drawings shows a conventional case subassembly 1 to surround and cover a PCA subassembly 3 of the kind shown in FIG. 2. The PCA subassembly 3 includes flash and controller packages and conventional passive components mounted on a printed circuit board. FIG. 3 shows the PCA subassembly 3 after it has been located within a hollow cavity 10 of the case subassembly 1. The foregoing is typical of a well-known technique used for manufacturing multimedia cards (MMC).

In particular, a thin metal foil cover 5 of the case subassembly 1 having a label sheet 7 affixed thereto is connected overtop a plastic frame 9 having the hollow cavity 10 located therewithin. The thin metal foil cover 5 is used as a top for the frame 9 so as to provide a sufficient space (of about 0.10 mm or less) above the PCA subassembly 3 (best shown in FIG. 3) while maintaining a desired overall card thickness of approximately 1.40 mm to meet MMC industry standards. Although it would be possible to manufacture the complete casing as a single, injection-molded plastic part, the top (corresponding to the metal foil cover 5 of FIG. 1) would be too thin (typically less than 0.1 mm) to be structurally sound.

Similarly, for a finished MMC card assembly 22 like that shown in FIG. 3, the label sheet 7 that is made of paper and contains product identification information is adhesively bonded to the metal foil cover 5 atop casing 9. The paper label sheet 7 has a thickness of approximately 0.05 mm which reduces the thickness available for the metal foil cover 5 to about 0.05 mm. A thin layer of adhesive film 12 is shown in FIG. 1 applied to the top of the plastic frame 9 to which the metal foil cover 5 is attached.

The PCA subassembly 3 shown in FIG. 2 typically includes a flash IC package 14 in the form of a TSOP (thin small outline package) type 1 leadframe package which contains a flash IC. Also included is a controller package 16 in the form of a land grad array (LGA) package and some passive components 17, such as resistors and capacitors. The TSOP flash IC package 14 has rows of external gull wing leads 18 along the opposite sides thereof. The PCA subassembly 3 is surface mounted to a thin PCB laminate substrate 20 that is approximately 0.25 mm thick.

To meet the industry thickness restraints for the MMC card assembly 22 shown in FIG. 3, the thickness of each component in the PCA subassembly 3 of FIG. 2 must be tightly controlled. For example, the distance above the TSOP flash IC package 14 of PCA subassembly 3 must allow sufficient space of approximately 0.10 mm for the attachment thereover of the metal foil cover 5 having a thickness of about 0.05 mm.

In the conventional card assembly 22 shown in FIG. 3, the vertical casing walls 24 are part of the plastic frame 9 of case subassembly 1, and the thin metal foil cover 5 with label 7 affixed thereto extends across the top of the frame 9 between the walls 24 thereof. The casing walls 24 are bonded to the PCB substrate 20 by a hot melt adhesive 26. FIG. 3 shows a typical solder interconnect (e.g., balls 28) by which the controller package 16 is connected to substrate 20. External contact pads 29 for the MMC card assembly 22 are located at the bottom of the PCB substrate 20.

Figure 4A:
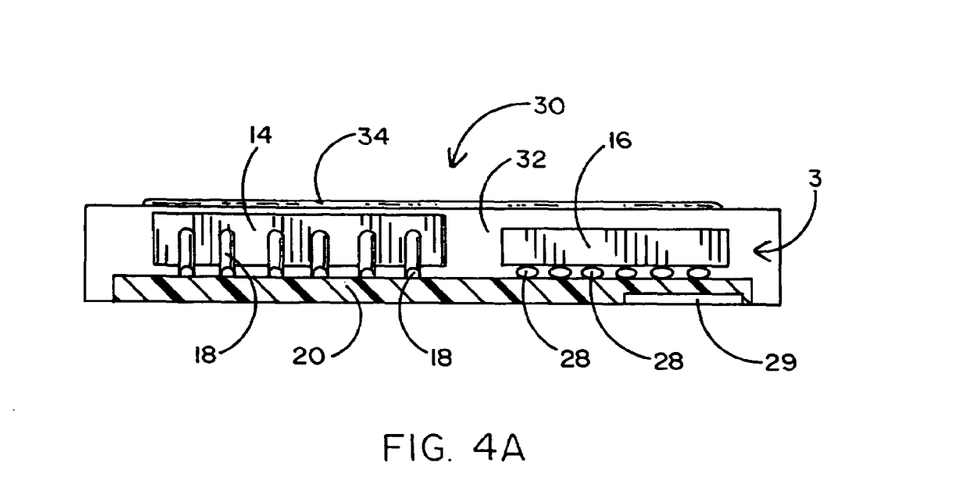
FIG. 4A shows an improved multimedia card (MMC) assembly with the PCA subassembly including a leadframe (TSOP) package encapsulated by an integral injection molded body.

FIG. 4A of the drawings shows an improved multimedia card (MMC) assembly 30. Card assembly 30 has a solid mold body 32 which surrounds the PCA subassembly 3 (of FIG. 2) in substitution of the conventional hollow frame 9 from the case subassembly 1 of FIG. 1. For purposes of illustration, the PCA subassembly 3 that is shown in FIG. 4A including the TSOP flash IC package 14, the controller package 16, and the PCB laminate substrate 20 are the same as those in FIG. 3. Therefore, identical reference numerals have been used in FIGS. 3 and 4A to identify identical components. However, it is to be understood that other suitable leadframe packages (e.g., WSOP, and the like) may be used in substitution of the TSOP package 14.

In accordance with a preferred embodiment, a resin material is injection molded around the entire PCA subassembly 3 to form the mold body 32 of card assembly 30. After molding and curing, the resin material will fully encapsulate the TSOP flash IC package 14, the controller package 16, and the PCB substrate 20 of PCA subassembly 3 to advantageously complete the solid mold body 32 and form a protective cover (in substitution of the thin metal foil cover 5 of FIG. 3) to which a label 34 can be attached while still conforming to the overall body thickness requirement of 1.40 mm nominal. In this same regard, the entire body 32 of the card assembly 30 of FIG. 4A is now an integral solid structure so as to present a more rugged and robust assembly while being resistant to the effects of liquid, moisture and bending forces.

The injection resin material used to form the solid body 32 of MMC card assembly 30 is selected so as to preferably have a relatively high melt flow index of 10 or more in order to be capable of minimizing the internal shear forces to be experienced by the PCA subassembly 3 as well as the solder connections by which the flash IC package 14 is attached to the PCB substrate 20. By way of example only, resin materials that are suitable to encapsulate the PCA subassembly 3 as shown in FIG. 4A may include polycarbonate, ABS, liquid crystal polymer and other high melt-flow engineering thermoset materials.

Figure 4B:
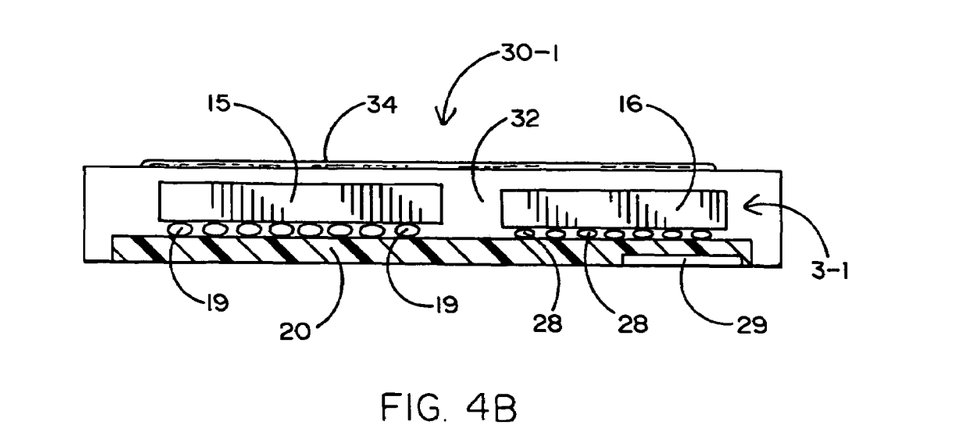
FIG. 4B shows the improved multimedia (MMC) assembly with the PCA subassembly including a leadless (CSP) package.

In FIG. 4A, a TSOP leadframe package 14 is shown encapsulated within the mold body 32 of card assembly 30. However, and as is shown in FIG. 4B, a leadless package, such as a chipscale package (CSP) 15, can be connected to the PCB substrate 20 by means of electrically conductive solder balls 19 in place of TSOP package 14. Thus, the MMC card assembly 30-1 of FIG. 4B includes a PCA subassembly 3-1 having the aforementioned CSP package 15 and the controller package 16 connected to substrate 20 and encapsulated within the solid resin mold body 32.

Figure 5:
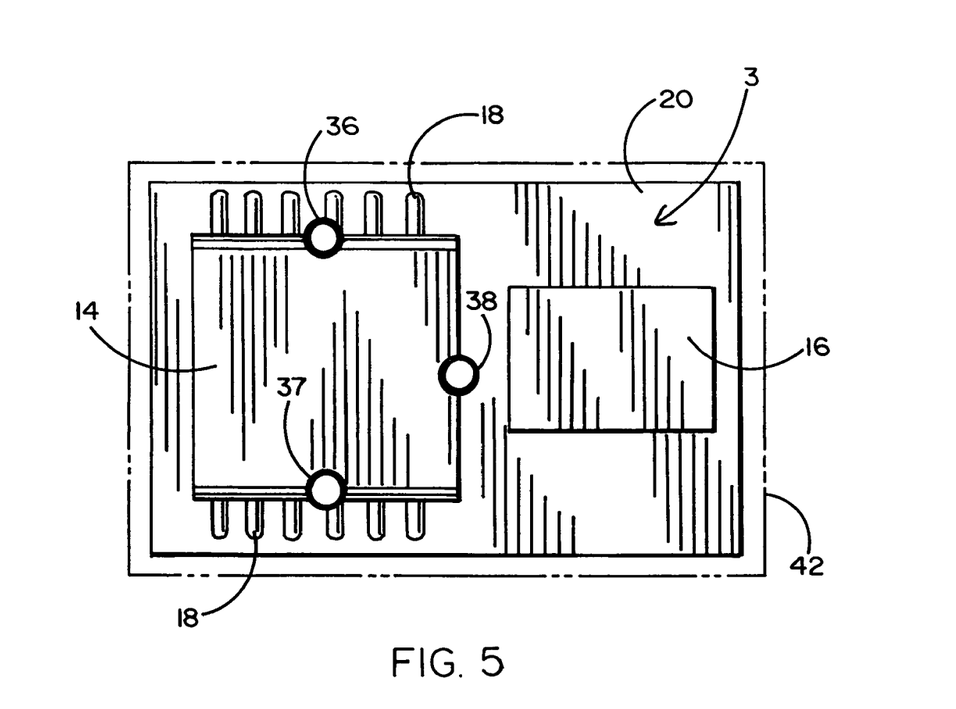
FIG. 5 shows the preferred runner gate opening locations relative to the PCA subassembly of FIG. 4A from inside the top of the mold cavity.

Turning now to FIG. 5 of the drawings, preferred locations 36, 37 and 38 are identified for openings by which runner gates can enter the top of a mold cavity 42 to form the injection molded body 32 of the MMC card assembly 30 of FIG. 4A. The locations 36-38 for the openings are selected so as to be careful not to damage the fragile flash IC that is inside the flash IC package 14. The preferred runner gate opening locations 36-38 are shown inside the mold cavity 42 and above the TSOP flash IC package 14 of PCA subassembly 3. The rows of leads 18 along opposite sides of package 14 are located under the runner gate opening locations 36 and 37 so that when the resin material is injected, it will first drop on the leads 18 which are already connected to and reinforced by the substrate 20. The additional gate opening location 38 is positioned above the front edge of the TSOP flash IC package 14 so that the force of the incoming resin will not be directly above the package 14 to avoid subjecting the package to excessive bending pressure. For purposes of symmetry, it is desirable to select either all three of the runner gate opening locations 36-38 or the two locations 36 and 37 above the respective rows of leads 36 and 37 from which to inject the resin material for encapsulating the PCA subassembly 3.

Figure 6:
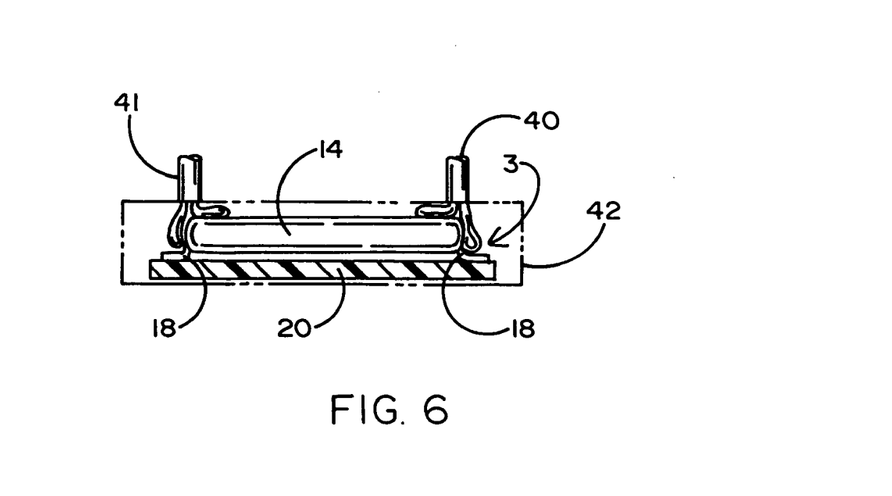
FIG. 6 shows the MMC card assembly of FIG. 4A and the directions of the mold resin flow in order to encapsulate the PCA subassembly.

FIG. 6 of the drawings shows the initial material flow during the injection molding over the PCA subassembly 3 within the mold cavity 42 when utilizing the runner gate locations 36 and 37 shown in FIG. 5. Runner gates 40 and 41 are located above the rows of external gull wing leads 18 along each side of the TSOP package 14. When the resin initially enters the mold cavity 42, a majority of the resin will flow down from its overhead location and cover the leads 18 of package 14. Additional resin will flow from overhead and cover the top of the TSOP package 14. This resin flow pattern advantageously reduces both the lateral shear forces applied to the TSOP package 14 during molding as well as the downward bending or normal forces generated from above package 14. Thus, the possibility of damaging the delicate flash IC inside the TSOP flash IC package 14 will be minimized.

Figure 7:
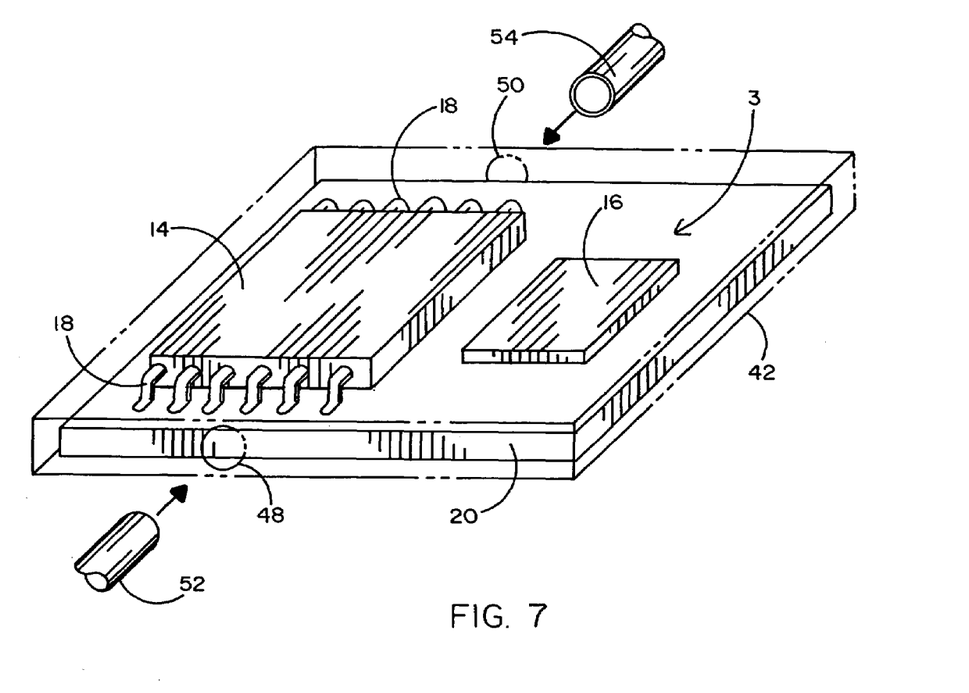
FIG. 7 shows alternate locations at which to inject the mold resin to encapsulate the PCA subassembly.

In an alternate embodiment, the runner gate locations are shown in FIG. 7 of the drawings as openings 48 and 50 at opposite sides of the mold cavity 42 adjacent the external rows of leads 18 of TSOP package 14. In this case, the runner gates 52 and 54 are axially aligned oppositely relative to one another at the left and right sides of the mold cavity 42 so that the mold material can be injected laterally and inwardly therewithin. More particularly, the runner gate opening locations 48 and 50 of FIG. 7 are located adjacent respective rows of leads 18 along each side of the TSOP flash IC package 14 so as to reduce the lateral shear forces applied to package 14 by introducing the resin material to cover the leads 18 first and thereby strengthen the solder connection between leads 18 and the PCB substrate 20.

When two runner gates 52 and 54 are employed in the manner shown in FIG. 7, the resin material can be simultaneously injected into the mold cavity 42 from the opposite left and right sides thereof at locations 48 and 50 in order to provide a more symmetrical and even distribution of the lateral shear and normal bending forces to which the TSOP package 14 will be susceptible. This is an improvement over a single runner gate location at which to inject the resin material which might undesirably push or shear the TSOP package 14 and possibly cause the soldered leads 18 to be disconnected from the PCB substrate 20 as a consequence of unbalanced forces over the package 14 inside the mold cavity 42.

It should be understood that the runner gate locations shown in FIGS. 5-7 are applicable to molds that are designed with either cold or hot runners. For either design, the shear imbalance inside the mold cavity is advantageously reduced so as to minimize the likelihood of damaging the flash IC and/or the controller IC that are located in their respective packages 14 and 16 of the PCA subassembly 3.

Figure 8:
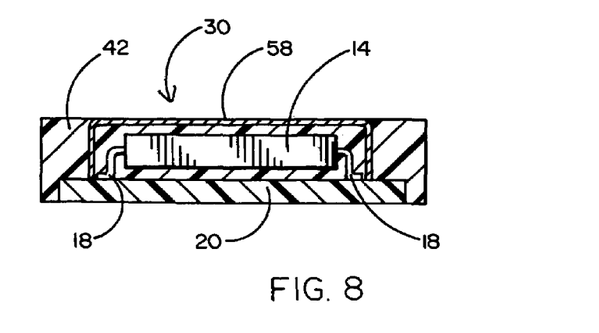
FIG. 8 shows the MMC card assembly of FIG. 4A with an optional protective cover sheet encapsulated within the mold body atop a flashcard package of the PCA subassembly.

Turning now to FIG. 8 of the drawings, an optional thin cover sheet 58 is shown predeposited over top of the TSOP flash IC package 14 prior to the injection molding step during which the mold body 32 of card assembly 30 is formed. Cover sheet 58 can be manufactured from thin metal foil or compliant plastic film and may be attached to the top of TSOP package 14 by means of adhesive bonding. The subsequent injection mold will surround cover sheet 58 and fill in the remaining spaces around PCA subassembly 3. When the injection molding has been completed, the cover sheet 58 is exposed to lie flush with the exterior surface line of the mold body 32. In this case, the cover sheet 58 ensures that the top of the TSOP package 14 will be covered and protected in the thin gap that is available thereover.

Figure 9:
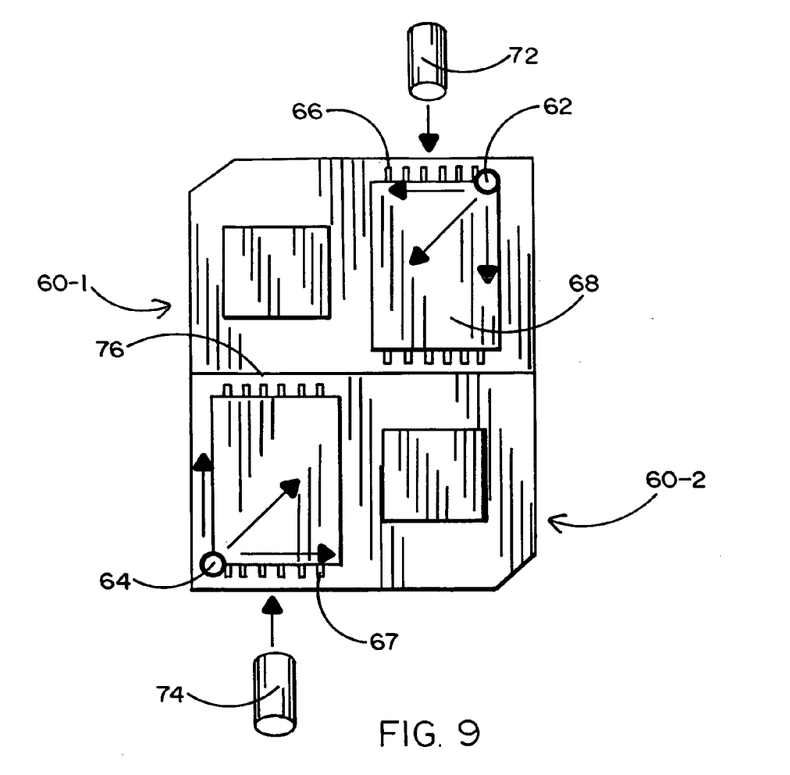
FIG. 9 shows a pair of adjacent card assemblies that are simultaneously molded from a single cavity by means of a single injection shot from respective runner gates.

Whether the injection runner gates are located at the top (as shown in FIG. 6) or at the opposite sides (as shown in FIG. 7), the mold that is used to form the final card assembly is a single cavity that is capable of forming one card per injection. In yet another embodiment of this invention, FIG. 9 of the drawings illustrates a single cavity from which a pair of adjacent MMC card assemblies 60-1 and 60-2 are formed in one injection shot. The foregoing is accomplished by choosing the runner gate locations 62 and 64 from the top so as to lie directly above a row of leads 66 and 67 along one side of each of the TSOP flash IC packages 68 and 70 from each card assembly 60-1 and 60-2. Alternatively, the runner gate locations can be from the sides of the card assemblies 60-1 and 60-2 adjacent the same row of leads 66 and 67 as indicated by the runner gates 72 and 74. After the molding process has been completed, the adjacent MMC card assemblies 60-1 and 60-2 are separated from one another by a saw cut along a boundary line 76 therebetween.

Figure 10:
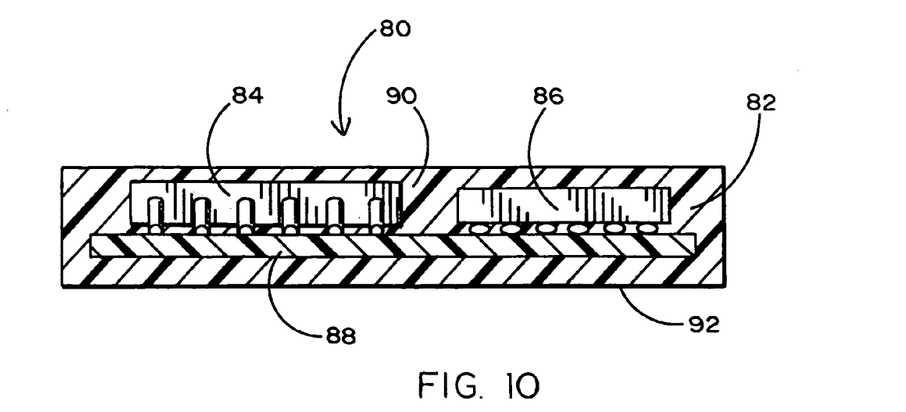
FIG. 10 shows a secure digital (SD) card assembly with a mold body encapsulating a PCA subassembly and extending above and below a PCB substrate.

It is to be understood that the teachings of this invention are also applicable to form small form factor digital memory cards other than the MMC card assembly that has been described while referring to FIGS. 4-9. For example, FIG. 10 of the drawings shows a secure digital (SD) card assembly 80 having a similar PCA subassembly 82 including a TSOP flash IC package 84 and a controller package 86 that are both surface mounted to a PCB substrate 88. The PCA subassembly 82 is surrounded by an injected resin mold body 90. However, in the case of the SD card assembly 80 of FIG. 10, the substrate 88 is initially held in place inside the mold cavity by positioning pins (not shown). Resin is injected from the top and bottom of the mold cavity during the same injection shot to lie above and below the PCB substrate 88. The external contact pads 92 are exposed to the exterior of the card assembly 80 through an opening that is formed in the bottom of the mold body 90 in accordance with the SD card design specifications.

By virtue of the foregoing method for molding a digital memory card, a PCA subassembly including a TSOP flash IC package and surface mount assembly can be used with injection molding whereby to lower the manufacturing cost, because no soft gold requirement is necessary for wirebonding. Likewise, there is no globtop or transfer mold cost. The packages containing flash and controller ICs can be pretested so that the post-assembly yield will be higher than that for the conventional COB process. Furthermore, TSOP packages are readily available and cheaper than other forms of package configurations such as CSP or thin TSOP. The one shot injection mold process allows the overall memory card assembly height to conform to accepted standards while providing a mold cover and protection within the thin gap that is available above the TSOP package of the PCA subassembly. By properly locating the runner gates from which to inject the resin material, it is possible to avoid damaging the ICs as well as the interconnection of the TSOP package to the PCB substrate.

We claim:

1. A method for making in a mold cavity a digital memory card including a printed circuit board substrate and a memory package enclosing a memory integrated circuit, said memory package having first and second rows of leads electrically connected to the substrate, said method comprising the steps of:

locating a first runner gate opening above the first of said first and second rows of leads of the memory package, and locating a second runner gate opening above the second of the first and second rows of leads of the memory package;

injecting a resin material into the mold cavity by way of said first and second runner gate openings to completely surround the memory package and form a cover over the top thereof, such that the resin flows downwardly into the mold cavity so that said first and second rows of leads of the memory package are covered at the same time; and curing the resin material to form an integral solid mold body within which the memory package is fully encapsulated and covered.

2. The method recited in claim 1, wherein said memory package is a thin small outline package and the memory integrated circuit enclosed thereby is a flash memory integrated circuit.

3. The method recited in claim 1, wherein said resin material injected into the mold cavity to completely surround and cover the memory package has a melt-flow index of at least 10.

4. The method recited in claim 1, including the additional step of locating a third runner gate opening above a front edge of the memory package, whereby said resin material will flow downwardly into the mold cavity to initially cover said first and second rows of leads and said front edge of the memory package.

5. The method recited in claim 1, wherein said digital memory card is a multimedia card.

6. The method recited in claim 1, wherein said digital memory card is a secure digital card.

7. The method recited in claim 6, including the additional step of injecting said resin material into the mold body so as to surround the top and bottom of the printed circuit board substrate to which said first and second rows of leads of the memory package are electrically connected.

8. The method recited in claim 1, wherein said digital memory card also includes a leadless controller package enclosing a controller integrated circuit and being electrically connected to the printed circuit board by means of solder balls, said step of injecting a resin material into the mold cavity also including completely surrounding the controller package such that the controller package is fully encapsulated with the memory package within said solid mold body.

9. A method for making in a mold cavity a digital memory card including a printed circuit board substrate and a memory package enclosing a memory integrated circuit, the memory package having first and second rows of leads running along respective opposite sides thereof and being electrically connected to the substrate, said method comprising the steps of:

bonding a cover sheet across the top of the memory package;

injecting a resin material into the mold cavity to surround the memory package and the cover sheet; and curing said resin material to form an integral solid mold body within which the memory package and said cover sheet are encapsulated, such that said cover sheet is located inside said solid mold body and flush with the top of said mold body to form a protective cover over top the memory package.

10. The method recited in claim 9, wherein said cover sheet is manufactured from metal foil.

11. The method recited in claim 9, wherein said cover sheet is manufactured from a plastic film.

12. A method for making a pair of digital memory cards within a single mold cavity, each memory card including a memory package enclosing a memory integrated circuit, and each memory package having first and second rows of leads running along respective opposite sides thereof and being electrically connected to the same printed circuit board substrate, said method comprising the steps of:

locating a first runner gate adjacent a first row of leads of the memory package from a first of the pair of digital memory cards;

locating a second runner gate adjacent a first row of leads of the memory package of the second of the pair of digital memory cards;

injecting a resin material from said first and second runner gates into the mold cavity to completely surround each of the memory packages of said pair of memory cards;

curing the resin material to form an integral solid mold body within which the memory packages of said pair of digital memory cards are fully encapsulated; and severing the printed circuit board substrate between the memory packages of said pair of digital memory cards so that said pair of digital memory cards are separated from one another.

13. A method for making in a mold cavity a digital memory card including a printed circuit board substrate and a memory package enclosing a memory integrated circuit, said memory package having first and second rows of leads running along respective first and opposite sides thereof and being electrically connected to the substrate, said method comprising the steps of:

locating a first runner gate opening at the first side of the mold cavity and next to the first of said first and second rows of leads of the memory package, and locating a second runner gate opening at the opposite side of the mold cavity and next to the second of the first and second rows of leads of the memory package;

injecting a resin material into the mold cavity by way of said first and second runner gate openings to completely surround the memory package and thereby form a cover over the top thereof, such that the first and second rows of leads of the memory package are covered with said resin material at the same time in order to balance lateral shear forces applied to said first and second rows of leads; and curing the resin material to form an integral solid body within which the memory package is fully encapsulated and covered.

* * * * *